United States Patent
Singh et al.

(10) Patent No.: US 6,444,381 B1
(45) Date of Patent: Sep. 3, 2002

(54) ELECTRON BEAM FLOOD EXPOSURE TECHNIQUE TO REDUCE THE CARBON CONTAMINATION

(75) Inventors: Bhanwar Singh, Morgan Hill; Ramkumar Subramanian, San Jose; Michael K. Templeton, Atherton; Bharath Rangarajan, Santa Clara; Khoi A. Phan, San Jose; Bryan K. Choo, Mountian View; Sanjay K. Yedur, San Ramon, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/729,295

(22) Filed: Dec. 4, 2000

Related U.S. Application Data

(60) Provisional application No. 60/242,904, filed on Oct. 24, 2000.

(51) Int. Cl.[7] .............................. G03F 9/00; G03C 5/00
(52) U.S. Cl. .............................. 430/30; 430/5; 430/296; 430/942; 382/144
(58) Field of Search .............................. 430/5, 30, 296, 430/942; 382/144

(56) References Cited

U.S. PATENT DOCUMENTS 5,843,603 A * 12/1998 Ando et al. .................. 430/30

* cited by examiner

*Primary Examiner*—Christopher G. Young
(74) *Attorney, Agent, or Firm*—Amin & Turocy, LLP

(57) ABSTRACT

One aspect of the present invention relates to a method for reducing carbon contamination on a mask involving placing a mask plate having carbon-containing contaminants thereon in a processing chamber; simultaneously contacting the mask plate with oxygen and exposing the mask plate with a flood exposure of electron beams wherein the carbon-containing contaminants are converted to a by-product; and removing the by-product from the processing chamber.

22 Claims, 4 Drawing Sheets

ELECTRON BEAM FLOOD EXPOSURE TECHNIQUE TO REDUCE THE CARBON CONTAMINATION

RELATED APPLICATIONS

This application claims domestic priority to provisional application Ser. No. 60/242,904 filed Oct. 24, 2000.

TECHNICAL FIELD

The present invention generally relates to improving mask fabrication by reducing defects on a mask. In particular, the present invention relates to using oxygen and an electron beam for minimizing and/or eliminating mask defects.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller feature sizes are required. Since numerous conductive features are typically present on a semiconductor wafer, the trend toward higher device densities is a notable concern.

The requirement of small features (and close spacing between adjacent features) requires high resolution lithographic processes. In general, lithography refers to processes for pattern transfer between various media. It is a technique used for integrated circuit fabrication in which a silicon slice, the wafer, is coated uniformly with a radiation-sensitive film, the photoresist. The photoresist coated substrate is baked to evaporate any solvent in the photoresist composition and to fix the photoresist coating onto the substrate. The baked coated surface of the substrate is next subjected to selective radiation using a mask; that is, a mask is employed to effect an image-wise exposure to radiation. The mask permits radiation to contact certain areas of the photoresist and prevents radiation from contacting other areas of the photoresist. This selective radiation exposure causes a chemical transformation in the exposed areas of the photoresist coated surface. Types of radiation commonly used in microlithographic processes include visible light, ultraviolet (UV) light and electron beam radiant energy. After selective exposure, the photoresist coated substrate is treated with a developer solution to dissolve and remove either the radiation-exposed or the unexposed areas of the photoresist (depending upon whether a positive photoresist or a negative photoresist is utilized) resulting in a patterned or developed photoresist.

The mask is a critical element in lithography. Defects in the mask lead to imprecise exposure and consequent decreases in resolution, precise pattern formation and/or the quality of subsequent processing steps. For example, a contaminant particle on a mask may prevent radiation from contacting an area of a photoresist that should receive radiation, resulting in an incompletely exposed photoresist, which would lead to an undesirable pattern formation in the subsequently developed photoresist. Mal-formed structures inhibit the proper function of semiconductor devices. Contaminant particles, especially carbon-containing contaminant particles, may be present in the air and are often traced to the extensive use of photoresists that contain organic materials.

The scanning electron microscope (SEM) is an instrument commonly employed for the evaluation of surfaces in the semiconductor industry. The SEM forms an image by focusing an electron probe onto the surface of the specimen and the image contrast is formed using the secondary electrons or the high energy back-scattered electrons which are generated at or near to the surface. The SEM can provide data in connection with the surface topography including linewidth and critical dimensions.

However, when evaluating surfaces, the SEM tends to undesirably form a carbon-containing film and/or cause undesired electrostatic charges on a scanned surface. Often, the SEM leaves carbon-containing contamination in the form of a film over the scanned portion of the mask. An accumulation of electrostatic charge on the mask surface tends to attract the airborne contaminants. Due to the nature of mask processing and fabrication, mask surfaces are especially susceptible to contamination and accumulation of electrostatic charges.

The concern over contaminant particles is great because one defect or particle on a mask may constitute a fatal defect requiring expensive and burdensome mask replacement or reconstruction. Moreover, as geometries shrink, small defects have an increasingly detrimental impact on mask processing. Therefore, there is an unmet need for an efficient method for detecting and removing carbon contaminants from a mask during mask production.

SUMMARY OF THE INVENTION

The present invention provides an improved mask fabrication process and system using oxygen and an electron beam for minimizing and/or eliminating mask defects. The present invention particularly provides methods for reducing mask defects caused by carbon contamination using an oxygen plasma or gaseous oxygen combined with an electron beam flood exposure, wherein the reactive environment promotes the conversion of carbon-containing contaminants to carbon dioxide, thereby removing the mask defects from a mask. As a result of the present invention, a subsequently patterned resist of increased quality (fewer pattern defects, improved resolution, etc.) comparable to a patterned resist where the masks of the present invention are not employed is obtainable.

One aspect of the present invention relates to a method for reducing carbon contamination on a mask involving placing a mask plate having carbon-containing contaminants thereon in a processing chamber; simultaneously contacting the mask plate with oxygen and exposing the mask plate with a flood exposure of electron beams wherein the carbon-containing contaminants are converted to a by-product; and removing the by-product from the processing chamber.

Another aspect of the present invention relates to a method for in-line detection and reduction of carbon contamination on a mask involving placing a mask plate in a processing chamber; detecting for the presence of carbon-containing contaminants on the mask plate; if carbon-containing contaminants are detected, then simultaneously contacting the mask plate with oxygen and exposing the mask plate with a flood exposure of electron beams wherein the carbon-containing contaminants are converted to a byproduct; and removing the by-product from the processing chamber.

Yet another aspect of the present invention relates to an in-line system for detecting and reducing carbon contamination on a mask containing a detector for detecting carbon-containing contaminants on the mask plate; a controller coupled to the detector for determining whether the mask plate enters a processing chamber to remove carbon-containing contaminants; and the processing chamber for simultaneously contacting the mask plate with oxygen and exposing the mask plate with a flood exposure of electron beams.

DISCLOSURE OF INVENTION

Figure 1:
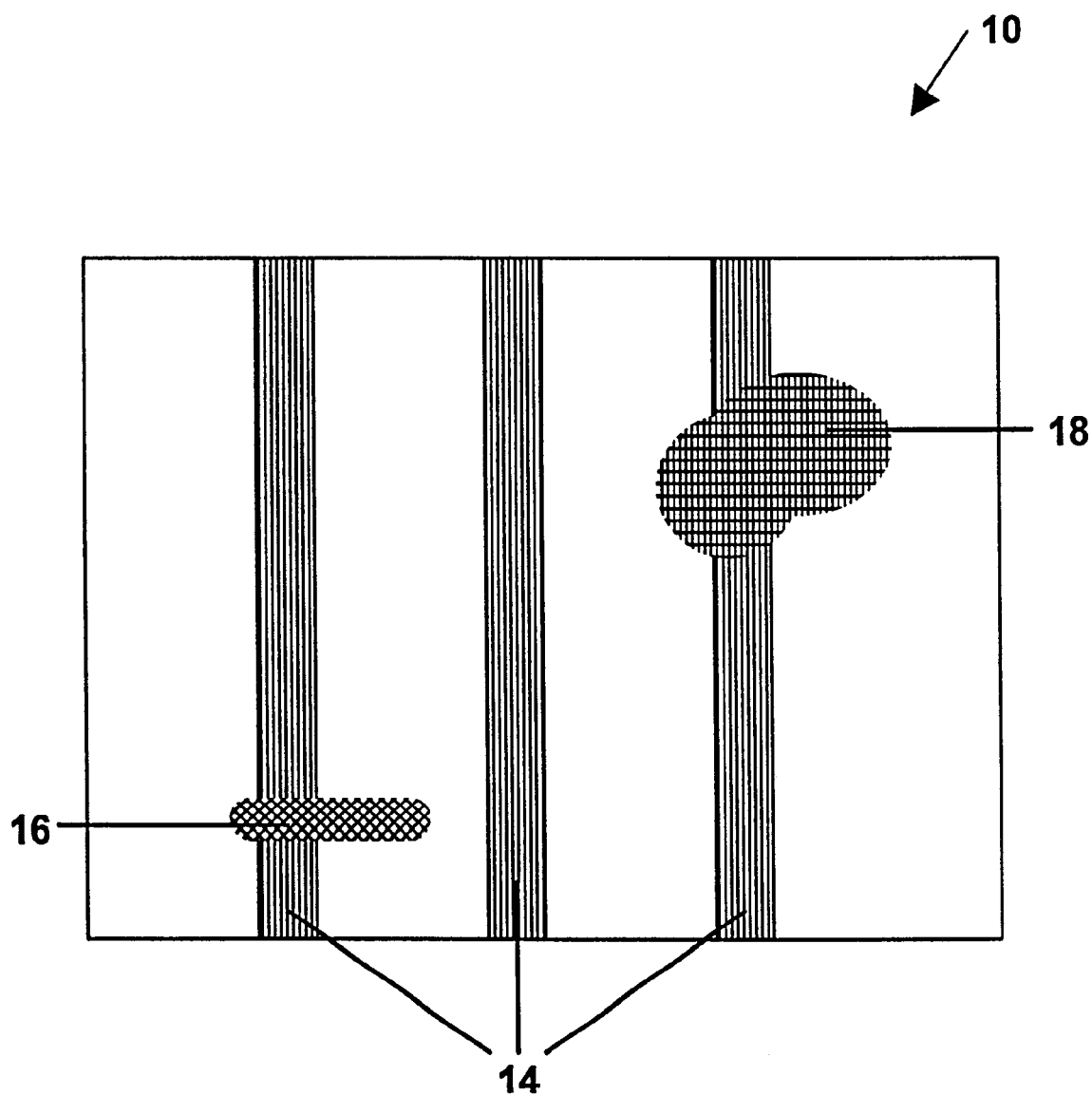
FIG. 1 illustrates a top-down view of a mask plate having carbon-containing contaminants thereon in accordance with one aspect of the present invention.

The present invention involves improving lithography by employing ionized or gaseous oxygen combined with an electron beam flood exposure to reduce defects on a mask. The present invention more specifically involves exposing a mask to a flood exposure of electron beams in a reactive ambient environment containing oxygen in a processing chamber to remove carbon contaminants from the mask without damaging the integrity and character of the mask before the mask is subsequently used in lithographic processing. Moreover, the present invention involves a system for removing carbon contaminants from the mask including in line, automated process control for determining whether or not carbon contaminants are present on the mask, and initiating removal if they are present.

During mask fabrication, as well as after mask fabrication, a mask plate is inspected for defects before it is employed in subsequent semiconductor processing. After the mask surface is inspected or evaluated, the mask plate is placed in a processing chamber where removal of mask defects occurs. The removal of mask defects is effected by simultaneously contacting the mask plate with oxygen plasma or oxygen gas and exposing the mask plate to a flood exposure of electron beams.

The mask inspected typically contains a translucent substrate, an opaque layer (that may or may not be patterned), and a resist layer (that may or may not be patterned). The substrate is typically quartz or glass. The opaque layer is typically chromium. The mask may be inspected at various times during fabrication (such as after patterning the resist or chromium layer), as well as after fabrication. The present invention may be implemented during or after any inspection.

The simultaneous flood exposure of electron beams and contact with oxygen promotes the conversion of the carbon-containing contaminants to the gaseous state (for example, conversion to carbon dioxide or vaporization). Conversion of the carbon-containing contaminants produces by-products. Examples of by-products include carbon dioxide and other vaporization products. As a result, the removal of the carbon-containing contaminants from the mask is effected. Not only are carbon-containing contaminants removed from the mask surface, but airborne carbon-containing contaminants are also removed from the processing chamber via an exhaust system.

Since electron beam resists, commonly used in mask fabrication, may be deleteriously affected by high energy electron beams (e.g., 25 keV to 30 keV), the flood exposure of electron beams in the present invention irradiates the mask surface at a relatively weak energy level to preserve the integrity of the electron beam resist that may be present on the mask. For example, weaker energy levels include those in the range of about 10 keV or less. In another embodiment, the energy level of the electron beam flood exposure is about 5 keV or less. In yet another embodiment, the energy level of the electron beam flood exposure is about 2.5 keV or less.

The chamber where flood exposure takes place contains oxygen, in the form of at least one of oxygen gas or oxygen plasma. In instances where oxygen plasma is employed, a suitable amount of plasma is charged into the chamber to promote removal of substantially all carbon-containing contaminants and preferably all carbon-containing contaminants. In one embodiment, the plasma flow contains from about 10 sccm to about 10 slm of oxygen. In another embodiment, the plasma flow contains from about 25 sccm to about 5 slm of oxygen. In yet another embodiment, the plasma flow contains from about 50 sccm to about 1 slm of oxygen.

Alternatively or additionally, the chamber contains a suitable amount of oxygen gas to remove substantially all carbon-containing contaminants and preferably all carbon-containing contaminants. In one embodiment, the chamber contains about 20% to about 100% oxygen by volume (at least about 20%). In another embodiment, the chamber contains about 25% to about 95% oxygen by volume (at least about 25%). In yet another embodiment, the chamber contains about 40% to about 90% oxygen by volume (at least about 40%).

The plasma and/or gas may further include one or more inert gases in addition to oxygen. Inert gases include nitrogen, helium, neon, argon, krypton, and xenon.

A vacuum may be employed to promote removal of the floating particles including the contaminants, carbon dioxide, and/or other vaporization products, from the processing chamber via an exhaust system. In one embodiment, the pressure in the processing chamber is from about 0.001 Torr to about 10 Torr. In another embodiment, the pressure in the processing chamber is from about 0.01 Torr to about 1 Torr.

The temperature during mask cleaning is effective for promoting the reduction of defects on the mask, without causing any damage or degradation to the mask or any components thereon. In one embodiment, the temperature in the processing chamber is from about 10° C. to about 100° C. In another embodiment, the temperature in the processing chamber is from about 20° C. to about 60° C.

Methods for reducing carbon-containing contaminants on a mask may be implemented in an in-line automated process control system. The in-line, automated process control system comprises a controller coupled to a defect detecting device. The defect detecting device inspects a mask for defects and transmits this information to the controller. The controller determines whether a mask requires mask defect removal by comparing the information to memory data stored by the controller. If a defect is detected, the controller directs the mask to the processing chamber where removal of mask defects occurs using an electron beam flood exposure in an oxygen containing environment. If a defect is not detected, the controller directs the mask on to further processing thereby bypassing the defect removal chamber.

Figure 2:
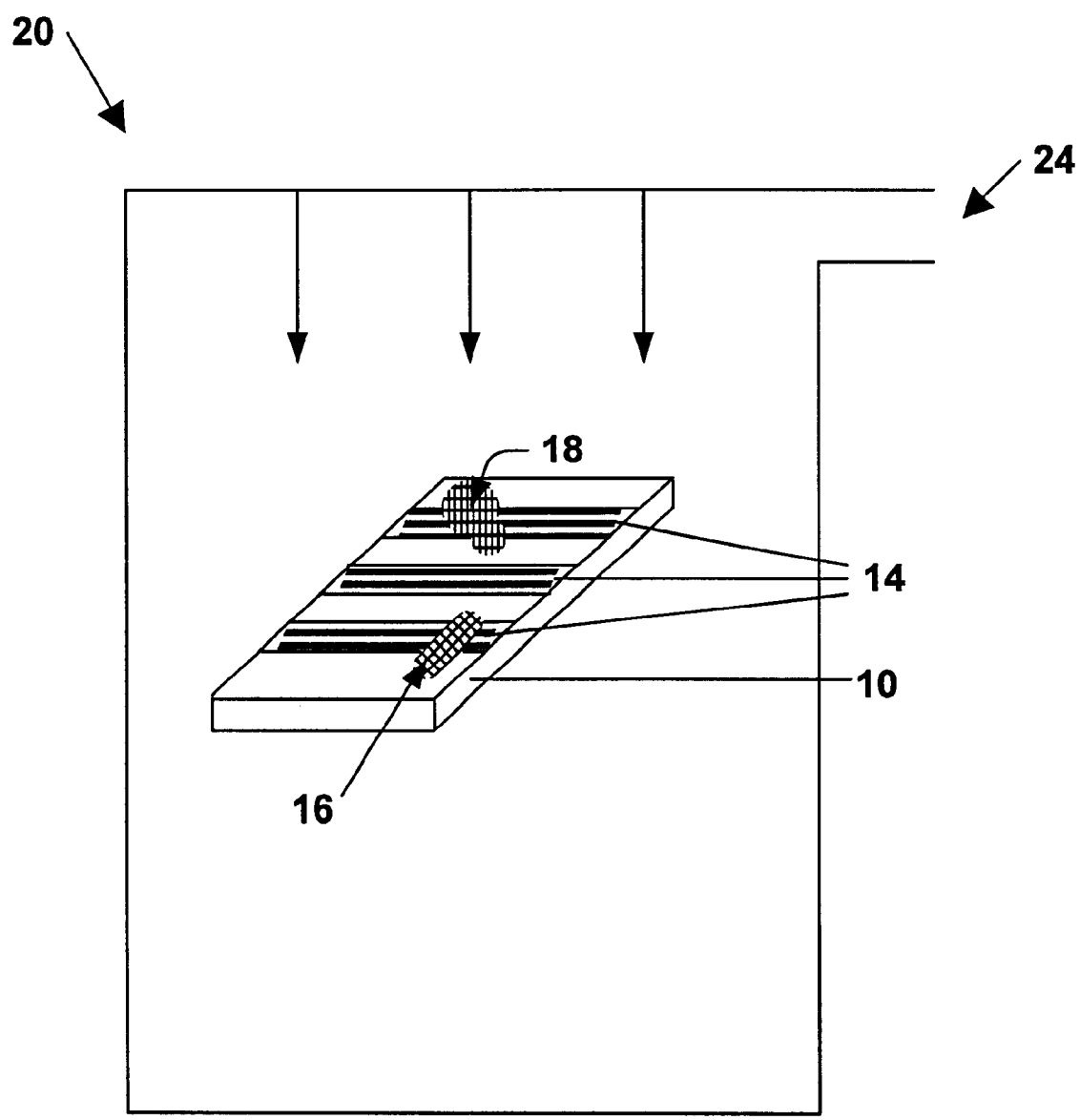
FIG. 2 illustrates a frontal view of a processing chamber housing a mask plate having carbon-containing contaminants thereon in accordance with one aspect of the present invention.
Figure 3:
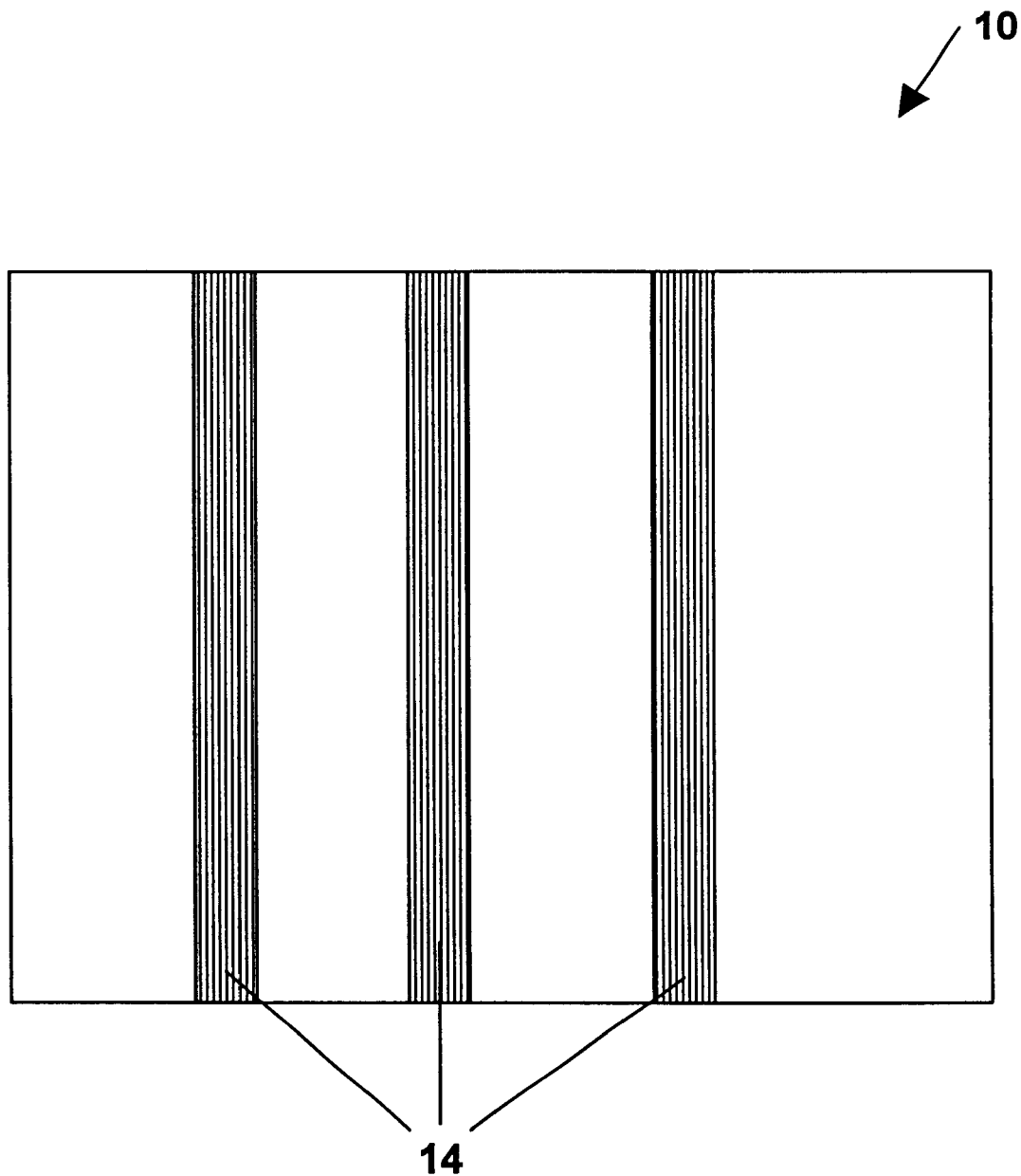
FIG. 3 illustrates a top-down view of a mask plate free of carbon-containing contaminants.

Referring generally to FIGS. 1 to 3, one exemplary embodiment of the present invention is described. Specifically referring to FIG. 1, a lithography mask 10 is shown having patterned chromium layer 14, a first defect 16 and a second defect 18. Defect 16 is a film of carbon-containing contamination caused by SEM inspection of the mask. Defect 18 may be carbon-containing contamination caused by airborne defects which have settled on the mask. If not removed, carbon-containing contamination defects 16 and 18 may prevent light from passing through regions not covered by patterned chromium layer 14, subsequently leading to malformed structures in a patterned resist (not shown).

Referring to FIG. 2, the lithography mask 10 is placed into a processing chamber 20. In this embodiment, the processing chamber 20 is an electron beam exposure chamber. The processing chamber 20 is equipped with an exhaust 24 in order to remove air/particles from the chamber. In another embodiment, the processing chamber 20 is equipped with a vacuum pump. A flood exposure of electron beams (represented by the arrows) and a plasma (not shown) containing ionized oxygen simultaneously contact the lithography mask 10 under a pressure of about 0.1 Torr at about 50° C. Alternatively, a 50/50 mixture of nitrogen and oxygen gas is present in the chamber. The carbon-containing contaminants from defects 16 and 18 are converted to carbon dioxide and thus removed from the lithography mask 10. Carbon dioxide is removed from the chamber 20 by the exhaust 24.

Referring to FIG. 3, the lithography mask 10 free or substantially free of carbon-containing contamination is shown. Since the patterned chromium layer 14 does not contain any carbon-containing defects, light freely passes therethrough without blockage. Moreover, contaminants in the open space of the processing chamber 20 are also eliminated.

Figure 4:
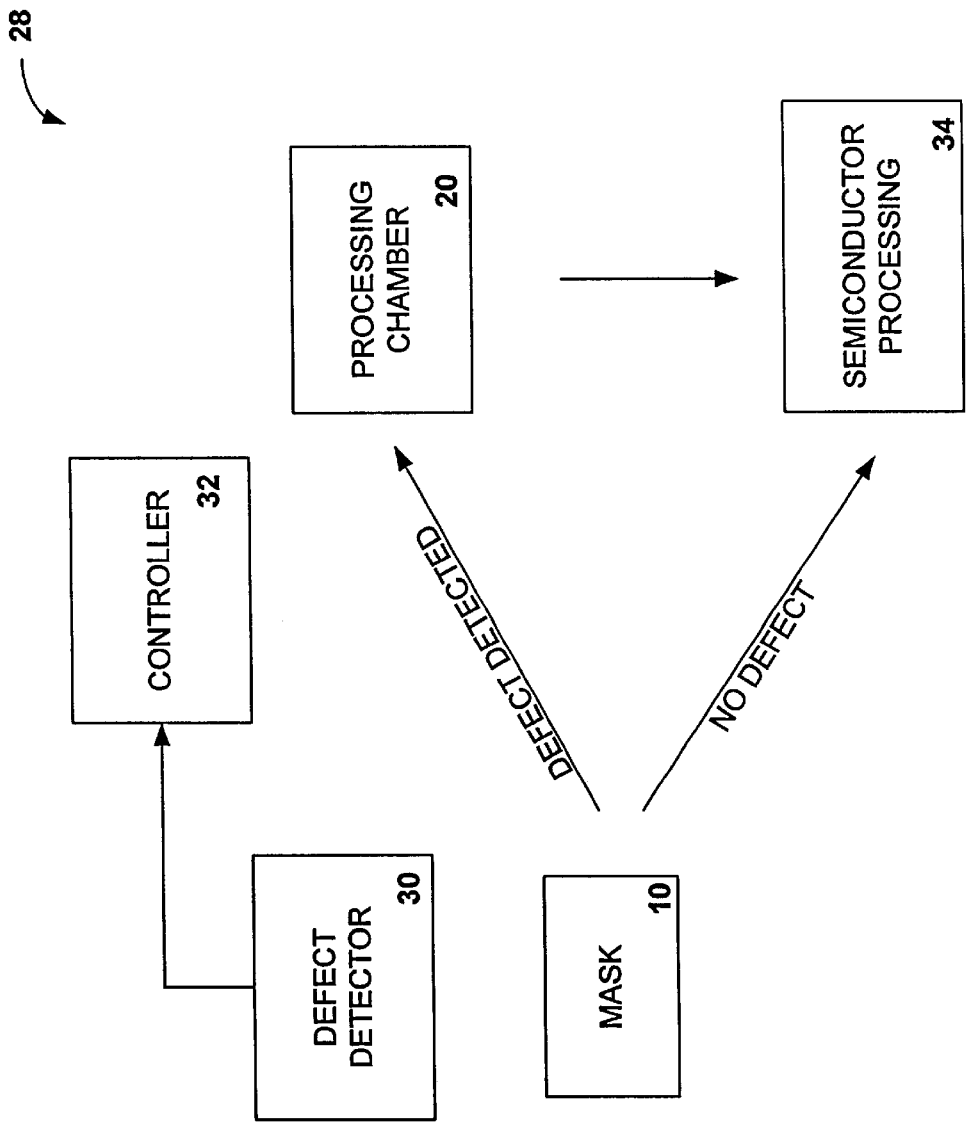
FIG. 4 illustrates a high-level schematic view of a system in accordance with one aspect of the present invention.

Referring to FIG. 4, a system 28 for reducing carbon-containing contamination on a mask surface is shown. A defect detector 30 is directed over a mask 10 as described with respect to FIG. 2. The defect detector 30 detects the presence and/or magnitude of carbon-containing contaminants on the surface of the lithography mask 10. Information from the defect detector 30 is transmitted to a controller 32. The Controller 32 determines which direction or route the lithography mask 10 takes, depending on the information transmitted by the carbon detector.

If carbon-containing contaminants (defects) are detected on the surface of the lithography mask 10, the controller 32 directs the mask 10 to the processing chamber 20 where the lithography mask 10 undergoes simultaneous oxygen and flood exposure of electron beams as described in FIG. 3. If no carbon-containing contaminants are detected, the controller 32 directs the lithography mask 10 on to further photolithographic processing 34, allowing the lithography mask 10 to bypass the processing chamber 20. Further photolithographic processing includes use of the mask in lithographic processes.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for reducing carbon contamination on a mask comprising:
   placing a mask plate having carbon-containing contaminants thereon in a processing chamber;
   simultaneously contacting the mask plate with oxygen and exposing the mask plate with a flood exposure of electron beams wherein the carbon-containing contaminants are converted to a by-product; and
   removing the by-product from the processing chamber.

2. The method of claim 1, wherein the oxygen is an oxygen plasma.

3. The method of claim 2, wherein the oxygen plasma comprises from about 25 sccm to about 5 slm of oxygen.

4. The method of claim 1, wherein the mask plate is contacted with the oxygen under a pressure from about 0.001 Torr to about 10 Torr.

5. The method of claim 1, wherein the mask plate is contacted with the oxygen under a temperature from about 10° C. to about 100° C.

6. The method of claim 1, wherein the oxygen is an oxygen gas.

7. The method of claim 6, wherein the processing chamber comprises from about 20% to about 100% by volume oxygen gas.

8. The method of claim 1, wherein the flood exposure of electron beams is conducted at an energy level of about 10 keV or less.

9. The method of claim 1, wherein the by-product is removed from the processing chamber using a vacuum pump or an exhaust.

10. A method for in-line detection and reduction of carbon contamination on a mask comprising:
    placing a mask plate in a processing chamber;
    detecting for the presence of carbon-containing contaminants on the mask plate;
    if carbon-containing contaminants are detected, then simultaneously contacting the mask plate with oxygen and exposing the mask plate with a flood exposure of electron beams wherein the carbon-containing contaminants are converted to a by-product; and
    removing the by-product from the processing chamber.

11. The method of claim 10, wherein if no carbon-containing contaminants are detected on the mask plate, then the mask plate bypasses the processing chamber and continues on to further lithographic processing.

12. The method of claim 10, wherein oxygen is an oxygen plasma.

13. The method of claim 12, wherein the oxygen plasma comprises from about 10 sccm to about 10 slm of oxygen.

14. The method of claim 10, wherein the mask plate is contacted with the oxygen under a pressure from about 0.01 Torr to about 1 Torr.

15. The method of claim 10, wherein the mask plate is contacted with the oxygen under a temperature from about 20° C. to about 60° C.

16. The method of claim 10, wherein the oxygen is an oxygen gas.

17. The method of claim 16, wherein the processing chamber comprises about 40% to about 90% by volume oxygen gas.

18. The method of claim 10, wherein the flood exposure of electron beams is conducted at an energy level of about 5 keV or less.

19. The method of claim 10, wherein the by-product is removed from the processing chamber using a vacuum pump or an exhaust.

20. An in-line system for detecting and reducing carbon contamination on a mask comprising:

a detector for detecting carbon-containing contaminants on a mask plate;

a controller coupled to the detector for determining whether the mask plate proceeds to a processing chamber to remove carbon-containing contaminants; and the processing chamber for simultaneously contacting the mask plate with oxygen and exposing the mask plate with a flood exposure of electron beams.

21. The system of claim 20, wherein the processing chamber comprises a vacuum pump or an exhaust for removal of carbon-containing contaminants.

22. The system of claim 20, wherein the oxygen contained in the processing chamber is an oxygen plasma or an oxygen gas.

\* \* \* \* \*